(12) United States Patent
Yu

(10) Patent No.: US 9,240,566 B2
(45) Date of Patent: Jan. 19, 2016

(54) METHOD FOR CURING UV-CURABLE RESIN AND METHOD FOR PACKAGING OLED

(71) Applicant: Shenzhen China Star Optoelectronics Technology Co., Ltd., Shenzhen, Guangdong (CN)

(72) Inventor: Wei Yu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 140 days.

(21) Appl. No.: 14/236,854

(22) PCT Filed: Nov. 26, 2013

(86) PCT No.: PCT/CN2013/087880
§ 371 (c)(1),
(2) Date: Feb. 3, 2014

(87) PCT Pub. No.: WO2015/070483
PCT Pub. Date: May 21, 2015

(65) Prior Publication Data
US 2015/0303401 A1    Oct. 22, 2015

(30) Foreign Application Priority Data
Nov. 15, 2013    (CN) .......................... 2013 1 0574199

(51) Int. Cl.
| | |
|---|---|
| *H01L 21/02* | (2006.01) |
| *H01L 51/52* | (2006.01) |
| *C03C 17/00* | (2006.01) |
| *H01L 51/56* | (2006.01) |

(52) U.S. Cl.
CPC ............ *H01L 51/5246* (2013.01); *C03C 17/00* (2013.01); *H01L 21/02348* (2013.01); *H01L 51/56* (2013.01)

(58) Field of Classification Search
CPC ................... H01L 21/02109; H01L 21/02296; H01L 21/02345; H01L 21/70; H01L 21/702; H01L 27/01
See application file for complete search history.

(56) References Cited

U.S. PATENT DOCUMENTS

| | | | |
|---|---|---|---|
| 4,246,315 A | 1/1981 | Kopp et al. | |
| 2005/0140291 A1* | 6/2005 | Hirakata et al. | 313/512 |

(Continued)

FOREIGN PATENT DOCUMENTS

| | | |
|---|---|---|
| CN | 101359722 A | 2/2009 |
| CN | 101867024 A | 10/2010 |

(Continued)

*Primary Examiner* — Cheung Lee
(74) *Attorney, Agent, or Firm* — Andrew C. Cheng

(57) ABSTRACT

The present invention provides a method for curing a UV-curable resin and a method for packaging an OLED. The method for curing a UV-curable resin includes (1) providing a UV light source and activating the UV light source to carry out a first irradiation operation on UV-curable resin; (2) de-activating the UV light source and, after a time interval of 10-300 seconds, activating the UV light source to carry out a second irradiation operation on the UV-curable resin; and (3) repeating step (2), until the UV-curable resin is completely cured. Interval-separated irradiation operations are applied so as to effectively lower down the temperature of a glass substrate and effectively avoid deterioration of an organic function layer caused by an excessively high temperature, thereby improving the lifespan and quality of an OLED device.

15 Claims, 6 Drawing Sheets

(56) References Cited

U.S. PATENT DOCUMENTS

2008/0225270 A1* 9/2008 Senga et al. .................... 356/51
2008/0266509 A1* 10/2008 Nishi et al. .................... 349/153

FOREIGN PATENT DOCUMENTS

| CN | 102185078 A | 9/2011 |
| CN | 103325918 A | 9/2013 |

* cited by examiner

US 9,240,566 B2

METHOD FOR CURING UV-CURABLE RESIN AND METHOD FOR PACKAGING OLED

BACKGROUND OF THE INVENTION

1. Field of the Invention

The present invention relates to a method for curing a UV (Ultraviolet) curable resin, and in particular to a method for curing a UV-curable resin and a method for packaging an OLED (Organic Light-Emitting Diode).

2. The Related Arts

An organic light-emitting diode or an organic light-emitting diode display (OLED), which is also referred to as an organic electroluminescent diode, is a new technology of display that has been developed since the middle of the twentieth century. Compared to liquid crystal displays, the organic electroluminescent diode possesses a variety of advantages, including full solid state, active emission of light, high brightness, high contrast, being ultra thin, low cost, low power consumption, fast response, wide view angle, wide range of operation temperature, being easy for flexible displaying.

Referring to FIG. 1, an organic electroluminescent diode generally comprises: a substrate 100, a light-emitting element 300 formed on the substrate 100, and a packaging cover 500 laminated on the substrate 100. The light-emitting element 300 comprises an anode 302 formed on the substrate 100, an organic function layer 304 formed on the anode 302, and a cathode 306 formed on the organic function layer 304. The substrate 100 and the packaging cover 500 are laminated together by means of a UV-curable resin 700 that is disposed therebetween and cured in order to hermetically enclose the light-emitting element 300 between the substrate 100 and the packaging cover 500 so that the organic function layer 304 of the light-emitting element 300 is protected against deterioration caused by invasion of humidity.

The organic function layer of the conventional organic electroluminescent diode is generally composed of three function layers, which are respectively a hole transport layer (HTL), an emissive layer (EML), and an electron transport layer (ETL). Each of these layers can be a single layer or a combination of at least one layer. For example, the hole transport layer is sometimes further separated into a hole injection layer and a hole transport layer and the electron transport layer can be further separated into an electron transport layer and an electron injection layer; however, the functions thereof are close and are collectively referred to as "hole transport layer" and "electron transport layer".

The common practice of the conventional organic electroluminescent diode adopted is glass packaging and both UV-curable resin package or glass resin package require a process of curing of the UV-curable resin. However, in the process of illuminating and curing a UV-curable resin with a UV light, the temperature of the glass substrate may also be raised. Excessively high temperature (exceeding the Tg point of the organic material) may result in property change of the organic material of the organic electroluminescent diode so as to affect the performance of the organic electroluminescent diode product. Thus, it is generally desired to keep the temperature of the glass substrate relatively low during the UV curing operation.

However, in an actual UV curing process, the stacked glass substrate, UV filter, and even flexible substrate (such as a polyethylene naphthalate (PEN) film) provided for flexible displaying, may require an extended time of UV irradiation in order to achieve a desired accumulated light quantity for curing the UV-curable resin at the transmittance of the UV band. Under this condition, the temperature of the glass substrate may get a remarkable rise and the OLED organic material may be affected.

For example, referring to FIG. 2, a temperature curve of a glass substrate is shown for OLED packaging with direct irradiation. In the plot, the irradiance of the UV light is 100 mw/cm$^2$ and after direction irradiation of the UV light for 180 seconds, the maximum temperature of the glass substrate is 90° C. This may result in deterioration of the OLED organic material and thus affect the quality of the OLED.

SUMMARY OF THE INVENTION

Thus, an object of the present invention is to provide a method for curing a UV (Ultraviolet)-curable resin, which has a simple process and can effectively dissipate the heat generated in the process.

Another object of the present invention is to provide a method for packaging an OLED (Organic Light-Emitting Diode), which effectively protects an organic function layer and improves the quality of an organic electroluminescent diode.

To achieve the objects, the present invention provides a method for curing a UV-curable resin, which comprises the following steps:

(1) providing a UV light source and activating the UV light source to carry out a first irradiation operation on a UV-curable resin;

(2) de-activating the UV light source and, after a time interval of 10-300 seconds, activating the UV light source to carry out a second irradiation operation on the UV-curable resin; and (3) repeating step (2) until the UV-curable resin is completely cured.

The UV light source has an irradiance of 100 mw/cm$^2$; the first irradiation operation and the second irradiation operation each have a time period of 60 seconds; the UV light source is de-activated for a lapse of time of 60 seconds; and step (2) is repeated for one time.

The activation and de-activation of the UV light source is controlled by a control system according to a predetermined time schedule.

The present invention also provides a method for packaging an OLED, which comprises the following steps:

(1) providing a glass substrate, wherein the glass substrate comprises a light-emitting element formed thereon;

(2) coating a UV-curable resin on the glass substrate in such a way that the UV-curable resin is set on an outer circumference of the light-emitting element;

(3) providing a packaging cover and laminating the packaging cover with the glass substrate;

(4) providing a UV light source and activating the UV light source to carry out a first irradiation operation on the UV-curable resin;

(5) de-activating the UV light source and, after a time interval of 10-300 seconds, activating the UV light source to carry out a second irradiation operation on the UV-curable resin; and (6) repeating step (5) until the UV-curable resin is completely cured.

The UV light source has an irradiance of 100 mw/cm$^2$; the first irradiation operation and the second irradiation operation each have a time period of 60 seconds; the UV light source is de-activated for a lapse of time of 60 seconds; and step (5) is repeated for one time.

The light-emitting element comprises: an anode formed on the glass substrate, an organic function layer formed on the anode, and a cathode formed on the organic function layer.

The organic function layer comprises: a hole transport layer formed the anode, an organic emissive layer formed on the hole transport layer, and an electron transport layer formed on the organic emissive layer.

The hole transport layer, the organic emissive layer, and the electron transport layer are formed by vapor deposition.

The packaging cover comprises a glass panel.

The activation and de-activation of the UV light source is controlled by a control system according to a predetermined time schedule.

The present invention further provides a method for packaging an OLED, which comprises the following steps:

(1) providing a glass substrate, wherein the glass substrate comprises a light-emitting element formed thereon;

(2) coating a UV-curable resin on the glass substrate in such a way that the UV-curable resin is set on an outer circumference of the light-emitting element;

(3) providing a packaging cover and laminating the packaging cover with the glass substrate;

(4) providing a UV light source and activating the UV light source to carry out a first irradiation operation on the UV-curable resin;

(5) de-activating the UV light source and, after a time interval of 10-300 seconds, activating the UV light source to carry out a second irradiation operation on the UV-curable resin; and (6) repeating step (5) until the UV-curable resin is completely cured;

wherein the UV light source has an irradiance of 100 mw/cm$^2$; the first irradiation operation and the second irradiation operation each have a time period of 60 seconds; the UV light source is de-activated for a lapse of time of 60 seconds; and step (5) is repeated for one time; and wherein the light-emitting element comprises: an anode formed on the glass substrate, an organic function layer formed on the anode, and a cathode formed on the organic function layer.

The organic function layer comprises: a hole transport layer formed the anode, an organic emissive layer formed on the hole transport layer, and an electron transport layer formed on the organic emissive layer.

The hole transport layer, the organic emissive layer, and the electron transport layer are formed by vapor deposition.

The packaging cover comprises a glass panel.

The activation and de-activation of the UV light source is controlled by a control system according to a predetermined time schedule.

The efficacy of the present invention is that the present invention provides a method for curing a UV-curable resin and a method for packaging an OLED, in which interval-separated irradiation operations are applied so as to effectively lower down the temperature of a glass substrate and effectively avoid deterioration of an organic function layer caused by an excessively high temperature, thereby improving the lifespan and quality of an OLED device.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 3:
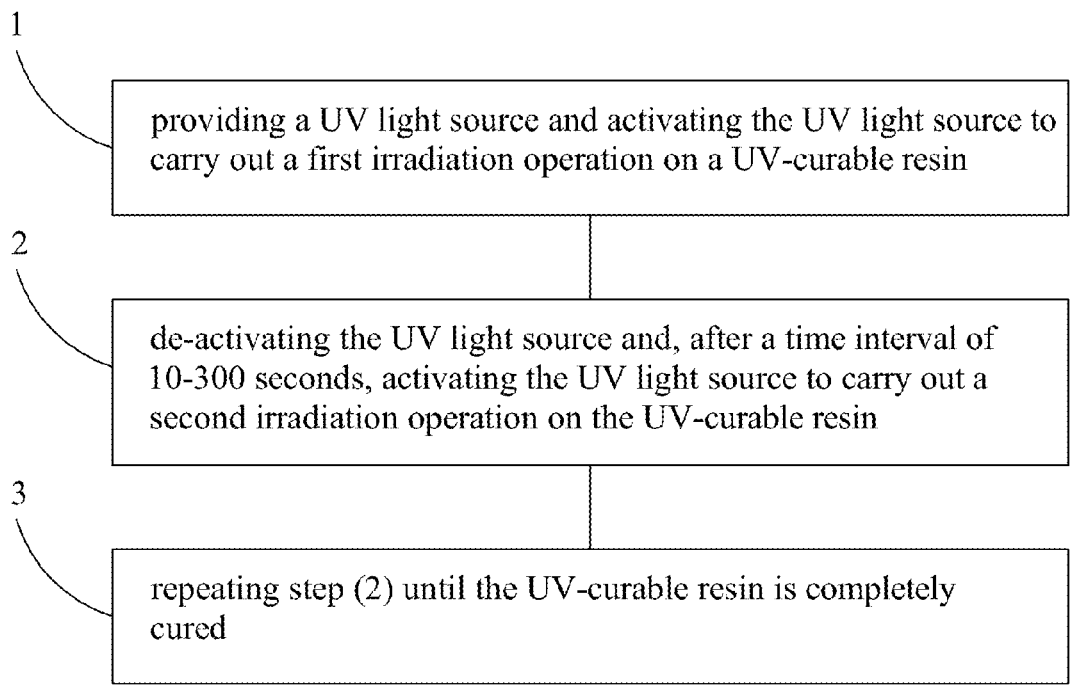
FIG. 3 is a flow chart illustrating a method for curing a UV-curable resin according to the present invention.
Figure 4:
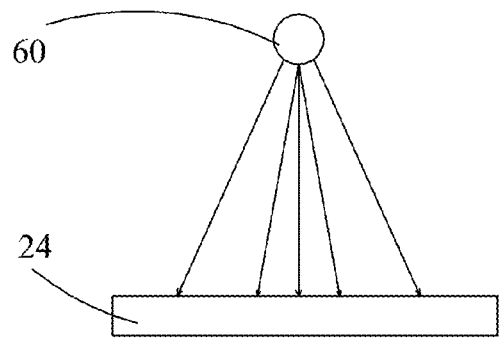
FIG. 4 is a schematic view demonstrating the method for curing a UV-curable resin according to the present invention.

Referring to FIGS. 3 and 4, the present invention providing a method for curing a UV-curable resin, which comprises the following steps:

Step 1: providing a UV light source 60 and activating the UV light source 60 to carry out a first irradiation operation on a UV-curable resin 24.

Specifically, for the UV light source 60 provided, the UV light source 60 provides an irradiance of 100 mw/cm$^2$. For activating the UV light source 60 to carry out the first irradiation operation on the UV-curable resin 24, the time period of the first irradiation operation is 60 seconds.

Step 2: de-activating the UV light source 60 and, after a time interval of 10-300 seconds, activating the UV light source 60 to carry out a second irradiation operation on the UV-curable resin 24.

Specifically, the UV light source 60 is deactivated and, after a time interval of 60 seconds, the UV light source 60 is activate again to carry out the second irradiation operation of the UV-curable resin 24. The time period of the second irradiation operation is 60 seconds.

Step 3: repeating Step 2 until the UV-curable resin 24 is completely cured.

Specifically, Step 2 is repeated one time, namely de-activating the UV light source 60 and, after a time interval of 60 seconds, re-activating the UV light source 60 to carry out a third irradiation operation on the UV-curable resin 24. The time period of the third irradiation operation is 60 seconds. This may achieve complete curing of the UV-curable resin 24.

It is noted that the activation and de-activation of the UV light source 60 is controlled by a control system according to a predetermined time schedule so that time control is precise and no over-irradiation or incomplete curing may be caused.

Figure 5:
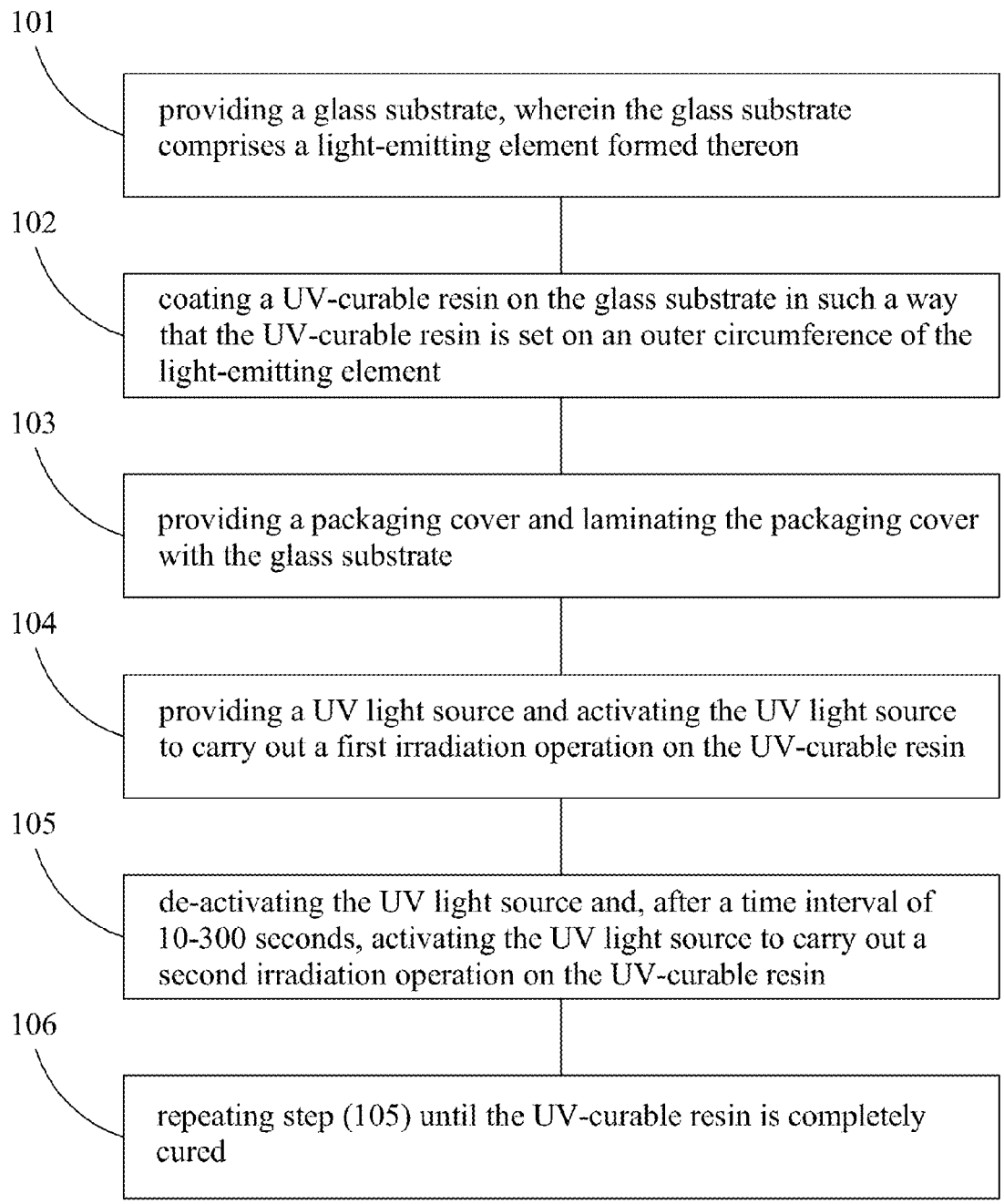
FIG. 5 is a flow chart illustrating a method for packaging an OLED according to the present invention.
Figure 6:
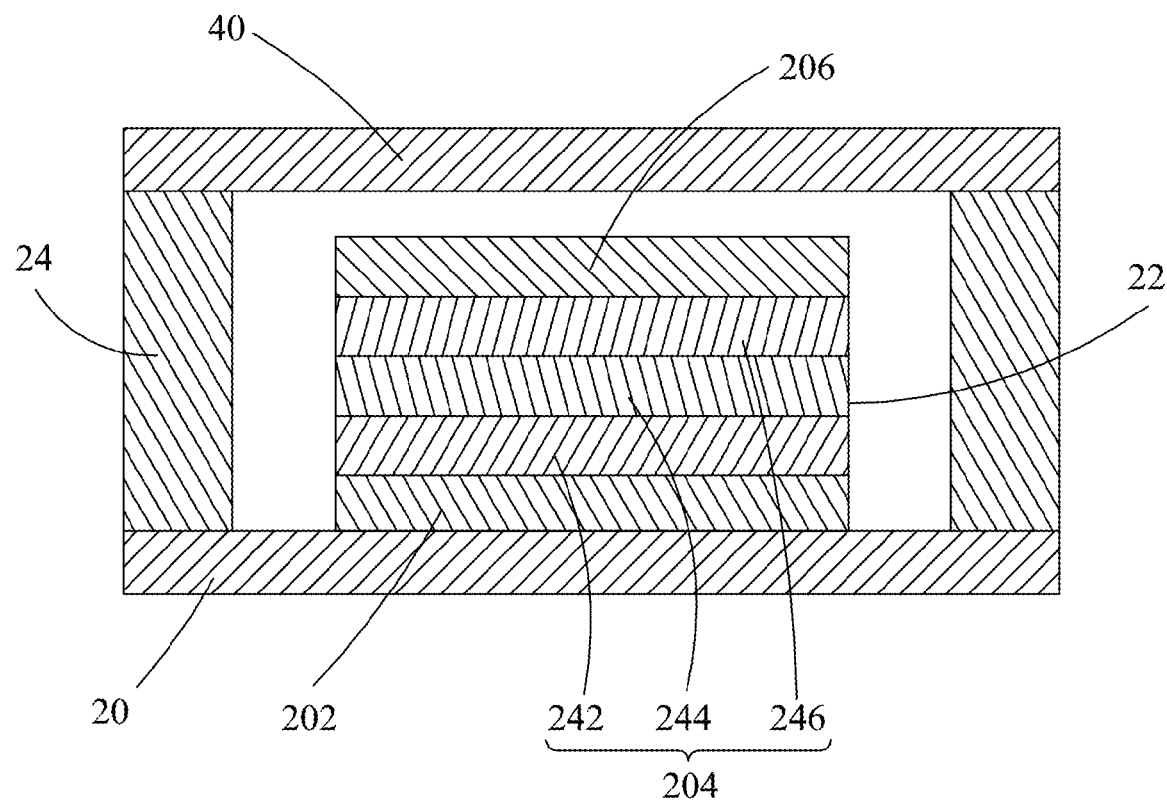
FIG. 6 is a schematic view showing the structure of an OLED that is packaged with the OLED packaging method according to the present invention.
Figure 7:
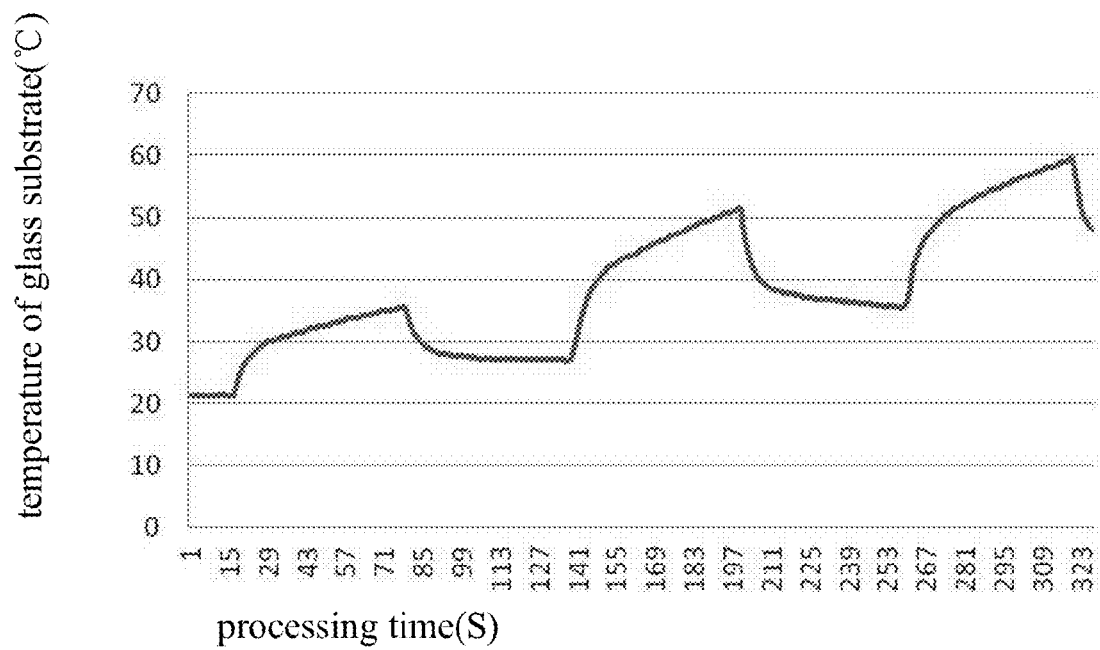
FIG. 7 is a schematic view showing a temperature curve of a glass substrate in packaging an OLED with the OLED packaging method according to the present invention.

Referring to FIGS. 5-7, with additional reference had to FIG. 4, the present invention also provides a method for packaging an OLED, which comprises the following steps:

Step 101: providing a glass substrate 20, wherein the glass substrate 20 comprises a light-emitting element 22 formed thereon.

Specifically, the light-emitting element 22 comprises: an anode 202 formed on the glass substrate 20, an organic function layer 204 formed on the anode 202, and a cathode 206 formed on the organic function layer 204.

Further, the organic function layer 204 comprises: a hole transport layer 242 formed on the anode 202, an organic emissive layer 244 formed on the hole transport layer 242, and an electron transport layer 246 formed on the organic emissive layer 244. The hole transport layer 242, the organic emissive layer 244, and the electron transport layer 246 are formed by vapor deposition.

Step 102: coating a UV-curable resin 24 on the glass substrate 20 in such a way that the UV-curable resin 24 is set on an outer circumference of the light-emitting element 22.

Step 103: providing a packaging cover 40 and laminating the packaging cover 40 with the glass substrate 20.

The packaging cover 40 is a glass panel.

Step 104: providing a UV light source 60 and activating the UV light source 60 to carry out a first irradiation operation on the UV-curable resin 24.

Step 105: de-activating the UV light source 60 and, after a time interval of 10-300 seconds, activating the UV light source 60 to carry out a second irradiation operation on the UV-curable resin 24.

Step 106: repeating Step 105 until the UV-curable resin 24 is completely cured.

Figure 1:
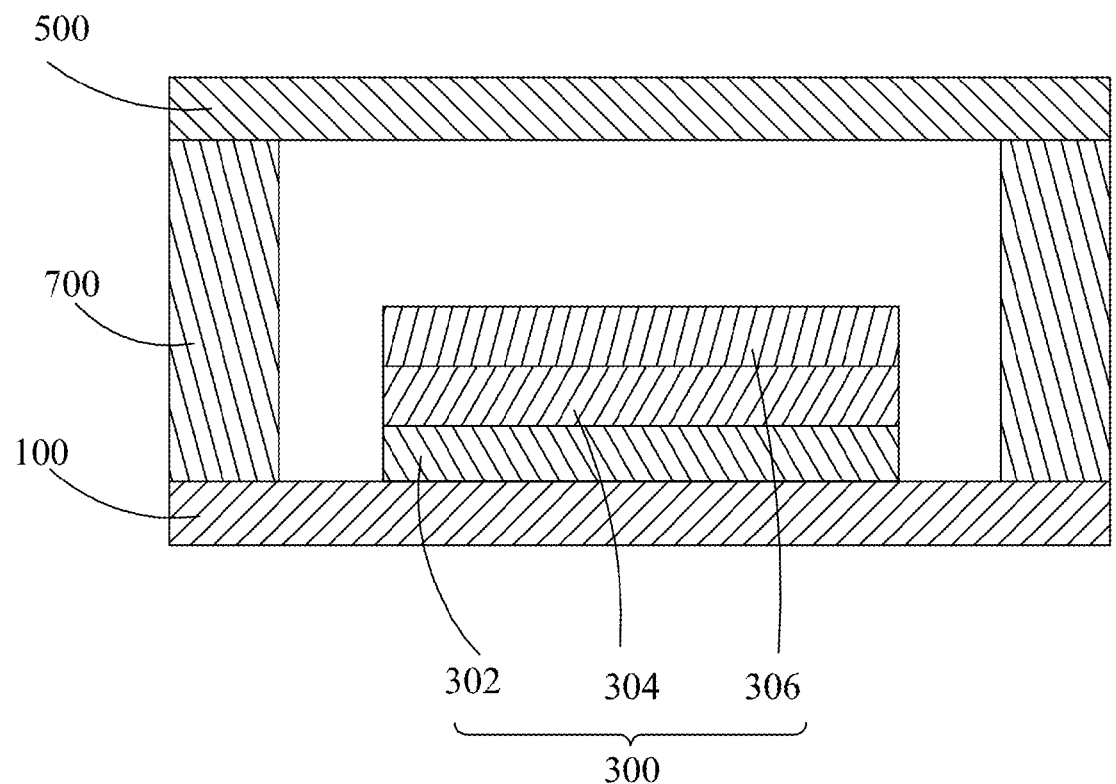
FIG. 1 is a schematic view showing the structure of a conventional organic electroluminescent diode.
Figure 2:
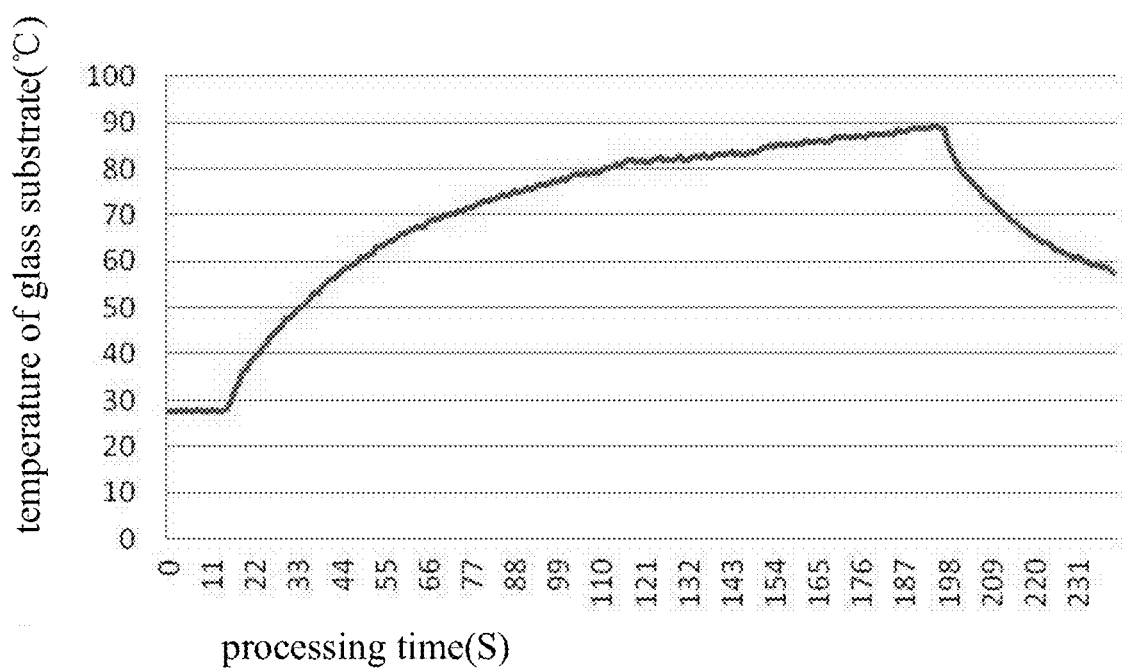
FIG. 2 is a schematic view showing a temperature curve of a glass substrate for packaging OLED with a conventional way of direct irradiation.

A practical example will now be descried for further explanation for a UV light source 60 that is provided to exhibit an irradiance of 100 mw/cm$^2$. Firstly, the UV light source 60 is activated to carry out the first irradiation operation of the UV-curable resin 24 and the time period of the first irradiation operation is set to 60 seconds; then, the UV light source 60 is de-activated and, after a time interval of 60 seconds, the UV light source 60 is activated to carry out the second irradiation operation of the UV-curable resin 24 and the time period of the second irradiation operation is also set to 60 seconds; afterwards, the UV light source 60 is de-activated again for a lapse of time of 60 seconds; and finally, the UV light source 60 is activated to carry out the third irradiation operation of the UV-curable resin 24 and the time period of the third irradiation operation is also set to 60 seconds, so that the UV-curable resin 24 is completely cured at this moment. A thermocouple is used to detect the temperature of the glass substrate 20 and the detected maximum temperature is 60° C. (as shown in FIG. 7). Compared to the maximum temperature of a glass substrate 20, which is 90° C. (see FIG. 2), subjected to direct irradiation with a UV light source 60 of 100 mw/cm$^2$ for 180 seconds, the temperature of the glass substrate 20 is lowered by 30° C., so that the temperature of the glass substrate 20 is effectively reduced and deterioration of the organic function layer caused by excessively high temperature can be avoided.

It is noted that the activation and de-activation of the UV light source 60 is controlled by a control system according to a predetermined time schedule.

A specific process can be calculating an accumulated light quantity required for curing a UV-curable resin according to the quantity of the UV-curable resin; calculating a required time period of irradiation according to the accumulated light quantity and the irradiance of a UV light source; determining the number of irradiation operations and the irradiation time of each of the irradiation operations according to the required time period of irradiation, with reference to the desired temperature of the glass substrate; setting up time intervals between irradiation operations according to cooling rate of the glass substrate; after the calculations, entering the number of irradiation operations, the time periods of the irradiation operations, and the time intervals among the irradiation operations into a control system so that the control system may control the activation and de-activation of the UV light source according to the data entered to achieve the interval-separated curing operations of the UV-curable resin.

In summary, the present invention provides a method for curing a UV-curable resin and a method for packaging an OLED, in which interval-separated irradiation operations are applied so as to effectively lower down the temperature of a glass substrate and effectively avoid deterioration of an organic function layer caused by an excessively high temperature, thereby improving the lifespan and quality of an OLED device.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for curing a UV (Ultraviolet)-curable resin, comprising the following steps:
    (1) providing a UV light source and activating the UV light source to carry out a first irradiation operation on a UV-curable resin having a predetermined quantity coated on a substrate;
    (2) de-activating the UV light source and, after a time interval of 10-300 seconds, activating the UV light source to carry out a second irradiation operation on the UV-curable resin, wherein the time interval between the de-activation of the first irradiation operation and the activation of the second irradiation operation is determined according to cooling rate of the substrate in order to control a maximum temperature of the substrate resulting from the irradiation operations to be lower than a predetermined level; and
    (3) repeating step (2) until the UV-curable resin is completely cured with the maximum temperature of substrate being controlled to be lower than the predetermined level.

2. The method for curing a UV-curable resin as claimed in claim 1, wherein the UV light source has an irradiance of 100 mw/cm$^2$; the first irradiation operation and the second irradiation operation each have a time period of 60 seconds; the UV light source is de-activated for a lapse of time of 60 seconds; and step (2) is repeated for one time.

3. The method for curing a UV-curable resin as claimed in claim 1, wherein the activation and de-activation of the UV light source is controlled by a control system according to a predetermined time schedule.

4. A method for packaging an OLED (Organic Light-Emitting Diode), comprising the following steps:
    (1) providing a glass substrate, wherein the glass substrate comprises a light-emitting element formed thereon;
    (2) coating a UV-curable resin of a predetermined quantity on the glass substrate in such a way that the UV-curable resin is set on an outer circumference of the light-emitting element;
    (3) providing a packaging cover and laminating the packaging cover with the glass substrate;
    (4) providing a UV light source and activating the UV light source to carry out a first irradiation operation on the UV-curable resin after the packaging cover and the glass substrate are laminated with each other;
    (5) de-activating the UV light source and, after a time interval of 10-300 seconds, activating the UV light source to carry out a second irradiation operation on the UV-curable resin, wherein the time interval between the de-activation of the first irradiation operation and the activation of the second irradiation operation is determined according to cooling rate of the glass substrate in order to control a maximum temperature of the lass substrate resulting from the irradiation operations to be lower than a predetermined level so as not to cause damage to the light-emitting element; and (6) repeating step (5) until the UV-curable resin is completely cured with the maximum temperature of substrate being controlled to be lower than the predetermined level.

5. The method for packaging an OLED as claimed in claim 4, wherein the UV light source has an irradiance of 100 mw/cm$^2$; the first irradiation operation and the second irradiation operation each have a time period of 60 seconds; the UV light source is de-activated for a lapse of time of 60 seconds; and step (5) is repeated for one time.

6. The method for packaging an OLED as claimed in claim 4, wherein the light-emitting element comprises: an anode formed on the glass substrate, an organic function layer formed on the anode, and a cathode formed on the organic function layer.

7. The method for packaging an OLED as claimed in claim 6, wherein the organic function layer comprises: a hole transport layer formed on the anode, an organic emissive layer formed on the hole transport layer, and an electron transport layer formed on the organic emissive layer.

8. The method for packaging an OLED as claimed in claim 7, wherein the hole transport layer, the organic emissive layer, and the electron transport layer are formed by vapor deposition.

9. The method for packaging an OLED as claimed in claim 4, wherein the packaging cover comprises a glass panel.

10. The method for packaging an OLED as claimed in claim 4, wherein the activation and de-activation of the UV light source is controlled by a control system according to a predetermined time schedule.

11. A method for packaging an OLED (Organic Light-Emitting Diode), comprising the following steps:

(1) providing a glass substrate, wherein the glass substrate comprises a light-emitting element formed thereon;

(2) coating a UV-curable resin of a predetermined quantity on the glass substrate in such a way that the UV-curable resin is set on an outer circumference of the light-emitting element;

(3) providing a packaging cover and laminating the packaging cover with the glass substrate;

(4) providing a UV light source and activating the UV light source to carry out a first irradiation operation on the UV-curable resin after the packaging cover and the glass substrate are laminated with each other;

(5) de-activating the UV light source and, after a time interval of 10-300 seconds, activating the UV light source to carry out a second irradiation operation on the UV-curable resin, wherein the time interval between the de-activation of the first irradiation operation and the activation of the second irradiation operation is determined according to cooling rate of the glass substrate in order to control a maximum temperature of the lass substrate resulting from the irradiation operations to be lower than a predetermined level so as not to cause damage to the light-emitting element; and (6) repeating step (5) until the UV-curable resin is completely cured with the maximum temperature of substrate being controlled to be lower than the predetermined level;

wherein the UV light source has an irradiance of 100 mw/cm$^2$; the first irradiation operation and the second irradiation operation each have a time period of 60 seconds; the UV light source is de-activated for a lapse of time of 60 seconds; and step (5) is repeated for one time; and wherein the light-emitting element comprises: an anode formed on the glass substrate, an organic function layer formed on the anode, and a cathode formed on the organic function layer.

12. The method for packaging an OLED as claimed in claim 11, wherein the organic function layer comprises: a hole transport layer formed the anode, an organic emissive layer formed on the hole transport layer, and an electron transport layer formed on the organic emissive layer.

13. The method for packaging an OLED as claimed in claim 12, wherein the hole transport layer, the organic emissive layer, and the electron transport layer are formed by vapor deposition.

14. The method for packaging an OLED as claimed in claim 11, wherein the packaging cover comprises a glass panel.

15. The method for packaging an OLED as claimed in claim 11, wherein the activation and de-activation of the UV light source is controlled by a control system according to a predetermined time schedule.

* * * * *